United States Patent [19]
Terashima et al.

[11] Patent Number: 5,995,582
[45] Date of Patent: Nov. 30, 1999

[54] X-RAY REDUCTION EXPOSURE APPARATUS AND DEVICE MANUFACTURING METHOD USING THE SAME

[75] Inventors: Shigeru Terashima, Utsunomiya; Masami Tsukamoto, Yokohama, both of Japan

[73] Assignee: Canon Kabushiki Kaisha, Tokyo, Japan

[21] Appl. No.: 08/835,721

[22] Filed: Apr. 10, 1997

[30] Foreign Application Priority Data

| Apr. 11, 1996 | [JP] | Japan | ................................. 8-089643 |
| Apr. 11, 1996 | [JP] | Japan | ................................. 8-089644 |
| Mar. 21, 1997 | [JP] | Japan | ................................. 9-068226 |

[51] Int. Cl.$^6$ ........................................... G21K 5/00
[52] U.S. Cl. ........................................... 378/34; 378/210
[58] Field of Search ................................. 378/34

[56] References Cited

U.S. PATENT DOCUMENTS

| 5,131,022 | 7/1992 | Terashima et al. | ............ 378/34 |
| 5,153,898 | 10/1992 | Suzuki et al. | ............ 378/34 |
| 5,157,700 | 10/1992 | Kurosawa et al. | ............ 378/34 |
| 5,222,112 | 6/1993 | Terasawa et al. | ............ 378/34 |

*Primary Examiner*—Craig E. Church
*Attorney, Agent, or Firm*—Fitzpatrick, Cella, Harper & Scinto

[57] ABSTRACT

A deflection mirror is disposed before an X-ray mask so as to reflect an X-ray beam and to project it to the X-ray mask. The X-ray mask is disposed opposed to a wafer with a distance D therebetween, and the X-ray beam reflected by the X-ray mask is projected onto the wafer through a reduction projection optical system. The deflecting mirror is disposed, in an example, at a position satisfying a relation $D>L>d/(\tan \delta_1+\tan \delta_2)$ where L is the distance from the X-ray mask to an edge of the deflection mirror closer to the path of the X-ray beam reflected by the X-ray mask, d is the width of irradiation of the X-ray beam upon the X-ray mask, and $\delta_1$ and $\delta_2$ are incidence angles of the X-ray beam at upper and lower edges of the irradiation width d, respectively, upon the X-ray mask. This assures a compact structure wherein, even when a wafer of a large diameter is used, illumination light to the mask is not intercepted.

20 Claims, 11 Drawing Sheets

X-RAY REDUCTION EXPOSURE APPARATUS AND DEVICE MANUFACTURING METHOD USING THE SAME

FIELD OF THE INVENTION AND RELATED ART

This invention relates to a reduction exposure apparatus for printing, by reduction projection exposure, a pattern such as a pattern for an LSI formed on a reflection type mask on a wafer with the use of radiation such as X-rays.

For an enhanced degree of integration and a better operation speed of a solid device such as an LSI, further miniaturization of a circuit pattern of a solid device has been attempted. For formation of such a circuit pattern, reduction projection exposure apparatuses using vacuum ultraviolet light as an exposure light source are used widely. The resolution of such an exposure apparatus mainly depends on the exposure wavelength $\lambda$ and numerical aperture NA of the projection optical system. In this respect, the resolution limit has been extended by enlarging the numerical aperture NA. However, because of a decrease in the depth of focus and difficulties in the design and manufacture of a refraction optical system, further improvement of the resolution limit becomes very difficult. In consideration of this, attempts have been made to shorten the exposure wavelength $\lambda$. For example, the exposure wavelength $\lambda$ has been changed from g-line ($\lambda$=435.8 nm) of a Hg lamp to i-line ($\lambda$=365 nm) and, then, to a KrF excimer laser ($\lambda$=248 nm). While the resolution can be improved by using a shorter wavelength of exposure light, because of a limitation in principle with respect to the magnitude of a wavelength of ultraviolet rays used for the exposure process, it is difficult to assure a resolution not higher than 0.1 micron with a mere extension of conventional technology.

In these situations, a lithographic method of X-ray reduction projection exposure using vacuum ultraviolet rays or soft X-rays as an exposure light source has attracted notice. FIG. 11 is a schematic view of an exposure optical system of such an X-ray reduction exposure apparatus. In this type of X-ray reduction exposure apparatus, as shown in FIG. 11, vacuum ultraviolet rays or soft X-rays emitted by an X-ray source 102 are reflected by a convexed-surface total reflection mirror 103 and a concaved-surface multilayered-film reflection mirror 104, such that, as illumination light, the reflected rays illuminate a reflection type mask 105. The reflection type mask 105 is provided with a predetermined pattern which is formed by a multilayered film effective to regularly reflect vacuum ultraviolet rays or soft X-rays. Vacuum ultraviolet rays or soft X-rays as reflected by the reflection type mask 105 advance through a reduction projection optical system 106 and impinge on a wafer 107 as exposure light, whereby a predetermined pattern is imaged on the wafer 107.

The reflection type mask 105 and the wafer 107 are placed on a mask stage and a wafer stage, respectively, both not shown in the drawing. Since the wavelength of vacuum ultraviolet rays or soft X-rays used for the exposure and illumination is approximately 4 to 20 nm, the resolution, in principle, determined with respect to the magnitude of the wavelength of the exposure light, can be increased.

In the X-ray reduction exposure apparatus described above, however, if a wafer of a large diameter is used such as in a case when a circuit pattern for a semiconductor memory device is to be produced, there is a possibility that, in the stepwise motion of the wafer for printing of plural patterns, depending on the position of the wafer, the wafer interferes with the path of light projected to the reflection type mask. In order to avoid this, the wafer may be disposed at a location far remote from the mask. With such a disposition, however, the exposure apparatus has to be considerably large in size. Particularly, the X-rays used in such an X-ray reduction exposure apparatus are those in a region called soft X-rays, and the whole or most of the optical system has to be placed in a vacuum. An increase in size of the apparatus, therefore, raises a serious problem with respect to cost also. For these reasons, practically, it is difficult to accomplish a mass-production division exposure apparatus, which may be called a stepper, with the structure that X-rays are projected from an X-ray source disposed behind a wafer.

SUMMARY OF THE INVENTION

It is accordingly an object of the present invention to provide an X-ray reduction exposure apparatus by which, even if a wafer of a large diameter is used, interception of illumination light to a mask is avoided with a simple structure.

In accordance with an aspect of the present invention, there is provided an X-ray reduction exposure apparatus for reduction projection of X-rays, emitted by an X-ray source and reflected by a reflection type mask, onto a wafer disposed opposed to the mask, wherein there is a deflection mirror effective to reflect the X-rays from the X-ray source, before the mask, to and project them to the mask. The deflection mirror may be, for example, disposed at a position satisfying a relation D>L>d/(tan δ1+tan δ2) where L is the distance from the mask to an edge of the deflection mirror closer to the path of X-rays reflected by the mask, D is the distance between the mask and the wafer, d is the width of irradiation of X-rays upon the mask, δ1 is the incidence angle of X-rays at one end of the irradiation width d upon the mask, and δ2 is the incidence angle of X-rays at another end of the irradiation width d upon the mask.

These and other objects, features and advantages of the present invention will become more apparent upon a consideration of the following description of the preferred embodiments of the present invention taken in conjunction with the accompanying drawings.

DESCRIPTION OF THE PREERRED EMBODIMENTS

Preferred embodiments of the present invention will be described, in conjunction with the drawings. While examples using soft X-rays as radiation will be explained below, use may be made of vacuum ultraviolet rays.

Figure 1:
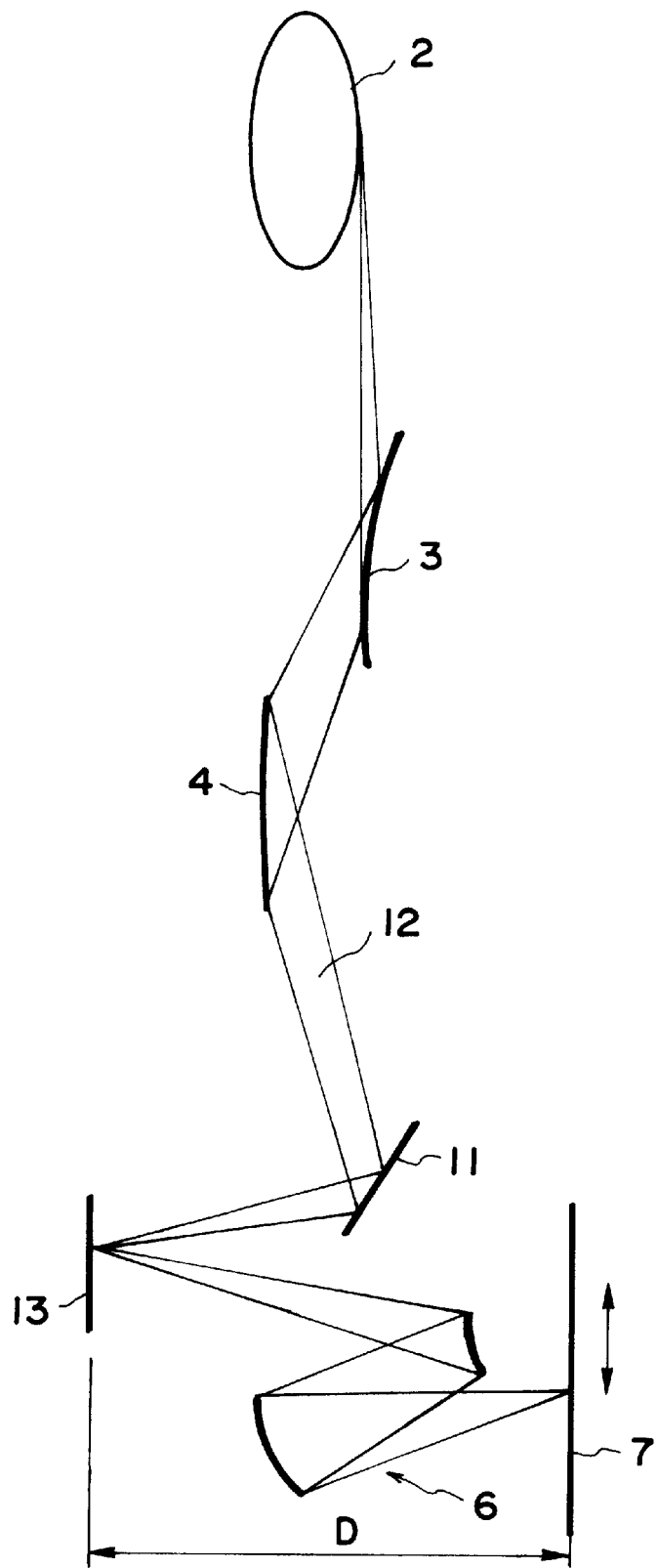
FIG. 1 is a schematic view of an arrangement of an optical system of an X-ray reduction exposure apparatus according to an embodiment of the present invention.
Figure 11:
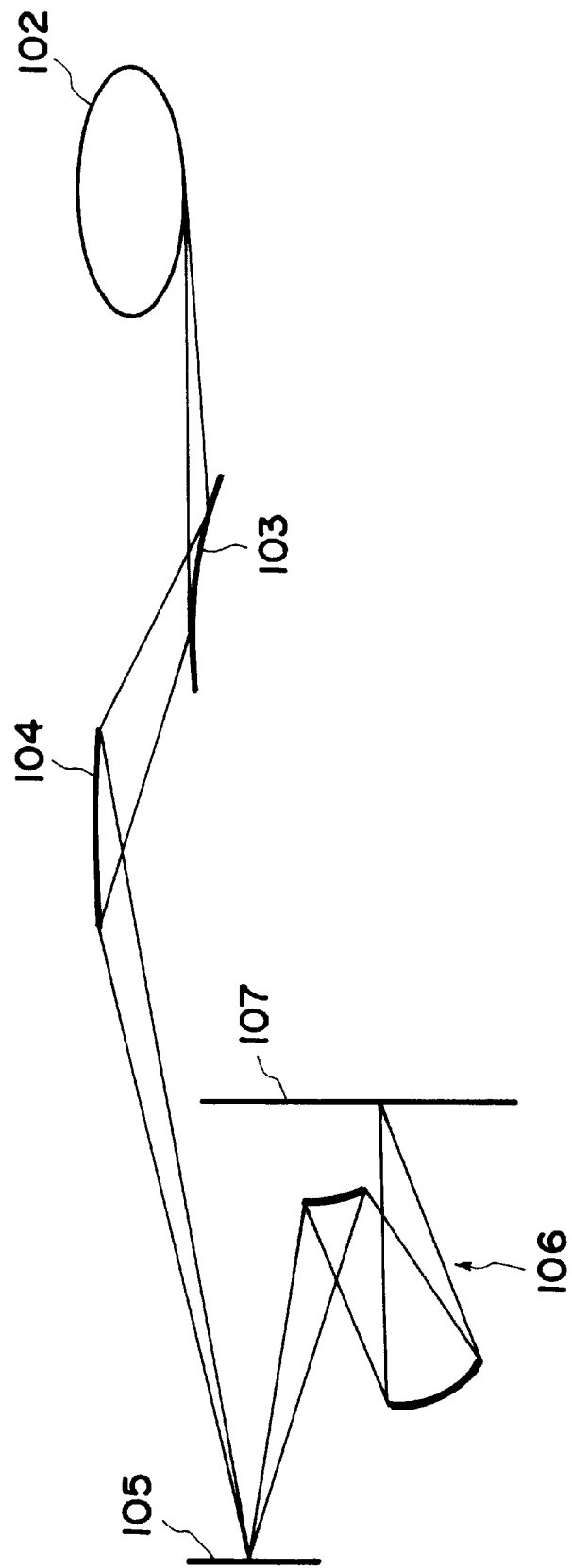
FIG. 11 is a schematic view of an optical arrangement of a conventional X-ray reduction exposure apparatus.

FIG. 1 shows an arrangement of an optical system of an X-ray reduction exposure apparatus according to an embodiment of the present invention. The exposure apparatus shown in FIG. 1 is adapted to perform reduction exposure of ⅕, and it is similar to the X-ray reduction exposure apparatus shown in FIG. 11 in the points that an X-ray beam emitted by an X-ray source 12 such as an undulator or a synchrotron is reflected by a convexed-surface total reflection mirror 3 and a concaved-surface multilayered-film reflection mirror 4, and that the X-ray beam 12 reflected by a reflection type X-ray mask 13 advances through a reduction projection optical system 6 and impinges on a wafer 7. The X-ray mask 13 and the wafer 7 are disposed opposed to each other with a distance D between them. With such a structure, the X-ray mask 13 and the wafer 7 are relatively scanned at an appropriate speed by moving stages for carrying them, by which a pattern in a necessary region of the X-ray mask 13 is transferred to one of different shot regions on the wafer 7. After pattern transfer to one shot region, the wafer is moved stepwise and the pattern transfer process is repeated to another shot region. Thus, through a step-and-scan sequence, patterns are printed on the wafer.

An important feature of the X-ray reduction exposure apparatus of this embodiment is that a deflection mirror 11 is disposed between the convexed-surface multilayered-film reflection mirror 4 and the X-ray mask 13 such that the X-ray beam 12 reflected by the reflection mirror 4 is reflected by the deflection mirror 11 and then is projected on the X-ray mask 13.

Figure 2:
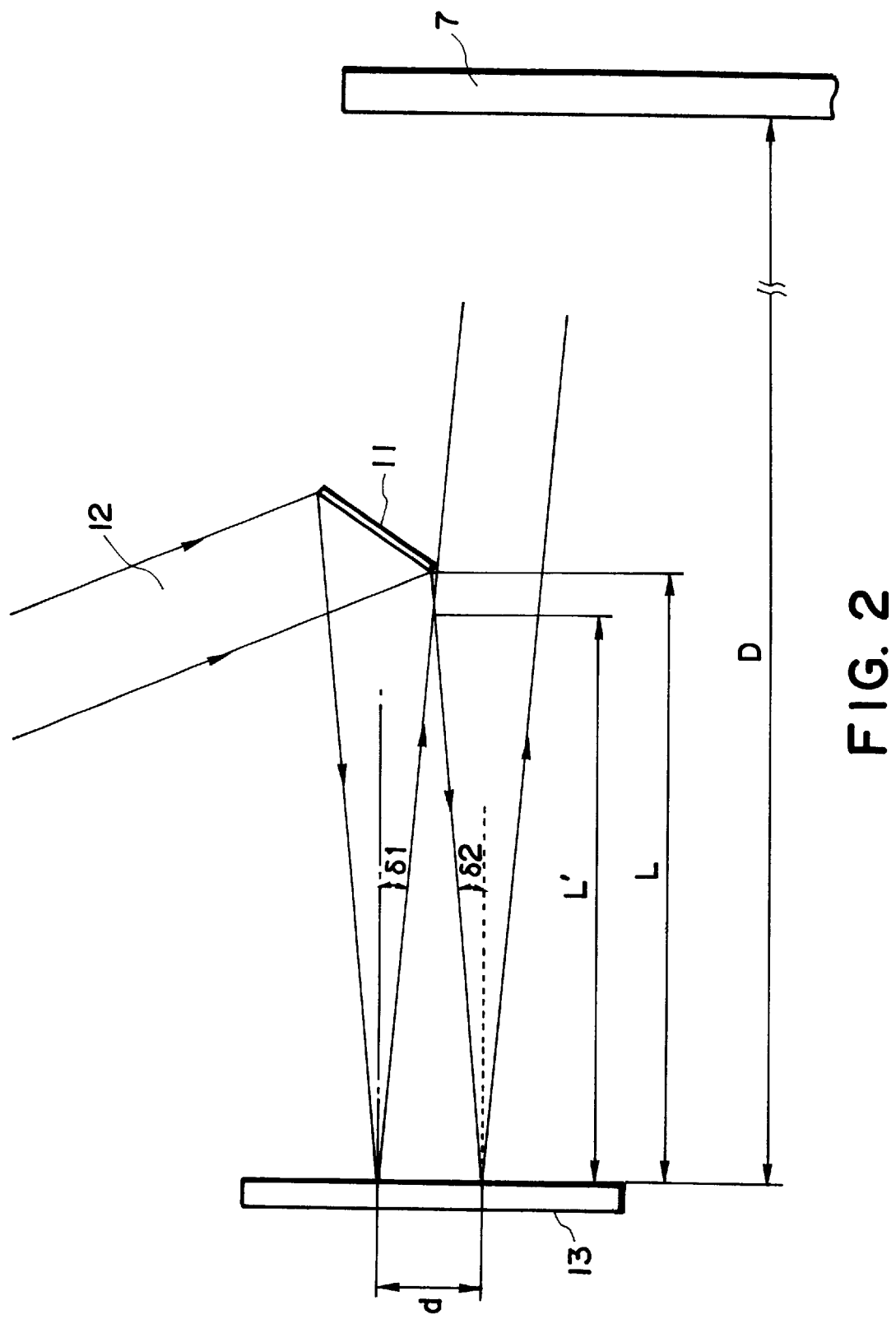
FIG. 2 is a schematic view for explaining a positional relation between an X-ray mask and a deflection mirror, in the optical system shown in FIG. 1.

Referring to FIG. 2, the positional relation between the X-ray mask 13 and the deflection mirror 11 will be explained. In FIG. 2, d is the width of irradiation of X-ray beam 12 upon the X-ray mask 13, δ1 is the incidence angle of the X-ray beam 12 at an upper edge of the irradiation width d upon the X-ray mask 13, δ2 is the incidence angle of the X-ray beam 12 at a lower edge of the irradiation width d upon the X-ray mask 13, and L is the distance from the X-ray mask 13 to an edge of the deflection mirror 11 closer to the path of X-ray beam 12 reflected by the X-ray mask 13. The reflection angle of the optical axis of the X-ray beam 12, from the X-ray mask 13, is the same as the incidence angle δ1 or δ2 to the X-ray mask 13.

As regards the optical system shown in FIG. 1, the whole of it or most of it has to be disposed in a vacuum as described hereinbefore. For reduction of the capacity of a vacuum chamber, the deflection mirror 11 may desirably be disposed at a position close to the X-ray mask 13. Also, in order to prevent distortion of an image as reflected by the X-ray mask 13, the incidence angle δ1 or δ2 of the X-ray beam to the X-ray mask 13 may desirably be smaller. However, if the deflection mirror 11 is provided while taking only such conditions into account, the deflection mirror 11 may intercept the path of X-ray beam 12 as reflected by the X-ray mask 13.

Here, if the X-ray beam 12 projected to the lower edge of the irradiation width d and the X-ray beam 12 reflected at the upper edge of the irradiation width d intersect with each other at a position spaced from the X-ray mask 13 by a distance L', a relation $$d/L' = \tan \delta1 + \tan \delta2$$

follows. Thus, the deflection mirror 11 should be disposed at a distance larger than the distance L'. From this, a condition $$L > d/(\tan \delta1 + \tan \delta2)$$

is determined. Namely, by disposing the deflection mirror 11 so that the distance L from the X-ray mask 13 to the deflection mirror 11 becomes larger than d/(tan δ1+tan δ2), the deflection mirror 11 does not intercept the path of reflection light from the X-ray mask 13.

On the other hand, if the deflection mirror 11 is disposed at a distance from the X-ray mask 13 larger than the distance from the wafer 7, similar to the case of a conventional X-ray reduction exposure apparatus, the wafer 7, when moved, may interfere with the path of projection to the X-ray mask 13. In order to avoid this, the deflection mirror 11 may well be disposed at a distance to the X-ray mask 13 shorter than the distance to the wafer 7. Thus, a condition D>L is determined.

Namely, by disposing the deflection mirror 11 at a position that satisfies the above-described two conditions, that is, a relation $$D > L > d(\tan \delta1 + \tan \delta2),$$

it is possible to accomplish an X-ray reduction exposure apparatus wherein, even it a wafer 7 of a large diameter is used and the exposure process is performed while moving that wafer, the path of X-ray beam 12 is not intercepted by the deflection mirror 11 or the wafer 7. Further, since the deflection mirror 11 is disposed between the X-ray mask 13 and the wafer 7 as easily seen from the above-described relation, the size of the apparatus is not enlarged.

Particularly, on an occasion when the X-ray beam 12 is projected on the X-ray mask 13 in the form of parallel light and thus δ1=δ2=δ, the deflection mirror 11 may be disposed at a position satisfying a relation $$D > L > d(2 \tan \delta).$$

In a particular example, the distance D between the X-ray mask 13 and the wafer 7 was 800 mm, and the irradiation region of the X-ray beam 12 upon the X-ray mask 13 was of a slit-like shape with a width d of 25 mm and a length of 200 mm. The incidence angles δ1 and δ2 of the X-ray beam 12 to the X-ray mask 13 were equal to each other, at the upper and lower edges of the irradiation width d, and δ–2 deg. From this, it follows that d/2 tan δ=358 mm. Thus, the deflection mirror 11 may be disposed at a distance L from the X-ray mask, within a range of 358 mm to 800 mm. In this particular example, L=400 mm.

Figure 3:
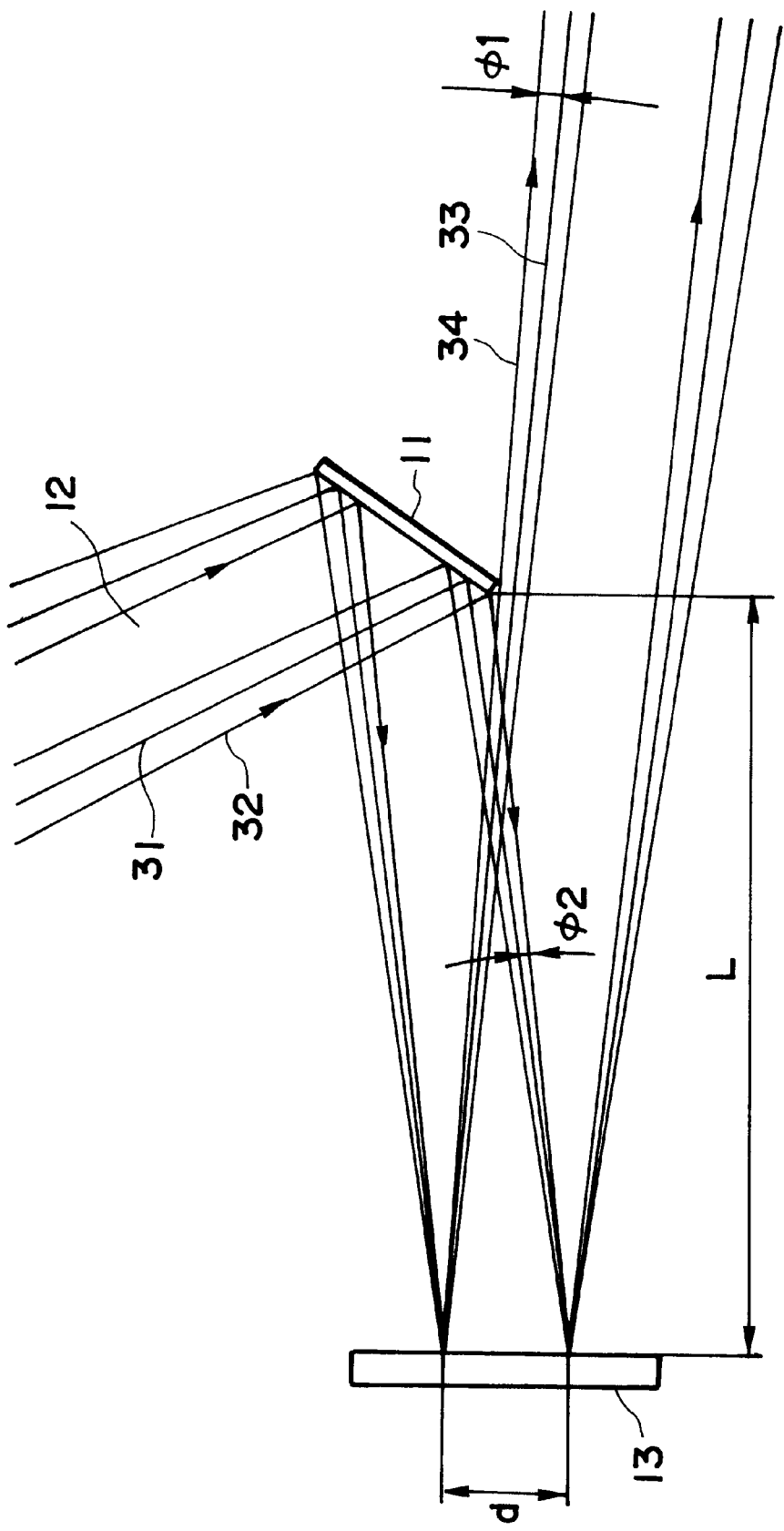
FIG. 3 is a schematic view for explaining a relation between a path of projected light to an X-ray mask and a path of reflected light from the X-ray mask, in an example wherein the aperture angle of an optical system is taken into account.
Figure 4:
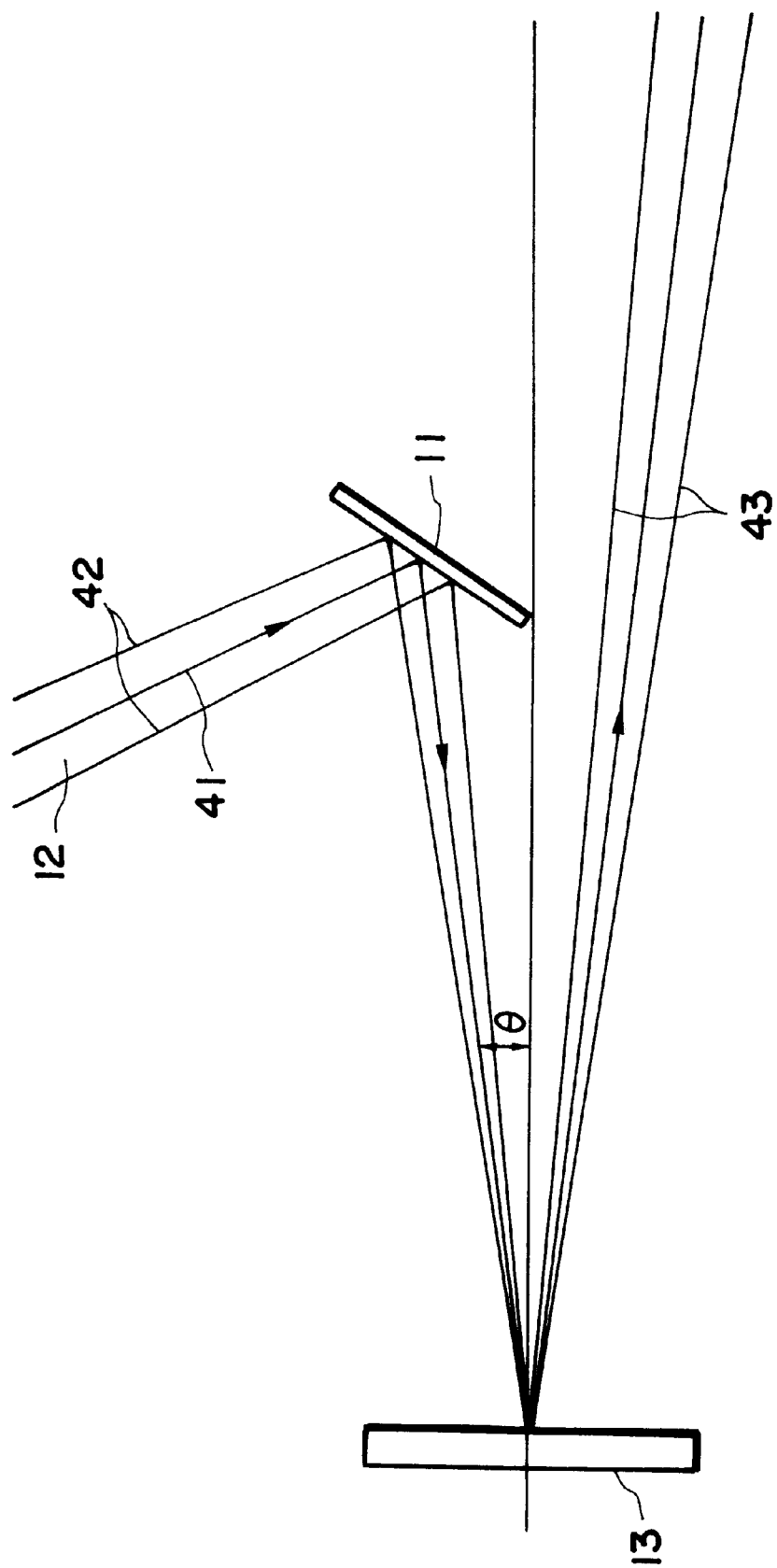
FIG. 4 is a schematic view for explaining further details of the relation illustrated in FIG. 3.

In the embodiment described above, particular note has not been Paid to the angular aperture of the optical system. Referring to FIGS. 3 and 4, a description will be made regarding conditions for setting the deflection mirror with the angular aperture taken into account. Here, the optical system from the X-ray light source to the X-ray mask 13 is called an illumination system, and the optical system from the X-ray mask 13 to the wafer is called an exposure system. Also, in FIG. 3, θ is the incidence angle of the optical axis of the X-ray beam 12 onto the X-ray mask 13, φ1 is the half angle of the angular aperture of the illumination system, and φ2 is the half angle of the angular aperture of the exposure system. Usually, the angular aperture of the illumination system is designed to be smaller than the angular aperture of the exposure system.

As shown in FIG. 4, in an optical system of an exposure apparatus, an X-ray beam 12 from an illumination system with a certain aperture is projected onto an X-ray mask 13 with an angle θ so that it is imaged upon the X-ray mask 13, and the light emerging therefrom is collected with the aperture of an exposure system (not shown) and is imaged upon a wafer. In FIG. 4, denoted at 41 is a chief ray of the X-ray beam 12, and denoted at 42 is the path of light from the aperture edge of the illumination system. Denoted at 43 is the path of light to the aperture edge of the exposure system. While an optical axis portion of the X-ray beam 12 is illustrated in FIG. 4, in the exposure apparatus, the illumination light is projected to irradiate an X-ray mask with a width d as has been described with reference to FIG. 2.

Details of this will be explained with reference to FIG. 3. In FIG. 3, denoted at 31 and 33 are chief rays of the X-ray beam 12 as projected to or emerging from the upper or lower edge of the irradiation width d with which the X-ray mask 13 is illuminated. Denoted at 32 is the path of light at the aperture edge of the illumination system, having an angle φ2 with respect to the chief ray 31 projected to the lower edge of the irradiation width d. Denoted at 34 is the path of light of the aperture edge of the exposure system, having an angle φ1 with respect to the chief ray 33 emerging from the upper edge of the irradiation width d. In this example, the chief rays 31 and 33 at the upper and lower edges of the irradiation width d are approximately parallel to each other.

The X-ray beam 12 is reflected by the deflection mirror 11 and is projected on the X-ray mask 13 with an angle θ. The chief rays 31 and 33 emerge with the same angle, and through the exposure optical system, they are projected on the wafer. Here, the distance L from the X-ray mask 13 to one edge of the deflection mirror 11, closer to the X-ray beam 12 as reflected by the X-ray mask 13, is restricted due to the relation between the projected rays to the X-ray mask 13 and the emerging rays from the X-ray mask 13. More specifically, considering the matter in accordance with what has been described with reference to FIG. 2, when L' is the distance between the X-ray mask 13 and the deflection mirror 11 on an occasion when the X-ray beam 12 projected to the lower edge of the irradiation width d intersects with the X-ray beam 12 reflected at the upper edge of the irradiation width d, the following relation results:

$$d/L' = \tan(\theta - \phi 1) + \tan(\theta - \phi 2).$$

Thus, by disposing the deflection mirror 11 within a range satisfying a relation $$D > L > d/\{\tan(\theta - \phi 1) + \tan(\theta - \phi 2)\},$$

it is possible to provide an X-ray reduction exposure apparatus wherein, even if a large-diameter wafer is used and the exposure process is performed while moving the wafer, the path of X-ray beam 12 is not intercepted by the deflection mirror 11 or the wafer, without enlarging the size of the apparatus.

In a particular example, the distance D between the X-ray mask 13 and the wafer was 800 mm, and the irradiation region of the X-ray beam 12 upon the X-ray mask 13 was of a slit-like shape with a width d of 25 mm and a length of 200 mm. Also, the incidence angle of the optical axis of the X-ray beam 13 onto the X-ray mask 13 was 4 deg., the half angle φ2 of the angular aperture of the illumination system was 3 deg., and the half angle φ1 of the angular aperture of the exposure system was 2 deg. It follows therefrom that $d/\{\tan(\theta - \phi 1) + \tan(\theta - \phi 2)\} = 477.3$ mm, and it is seen that the deflection mirror 11 may be disposed at a distance L from the X-ray mask, which is within a range of 477.3 mm to 800 mm. In this particular example, L=500 mm.

Figure 5:
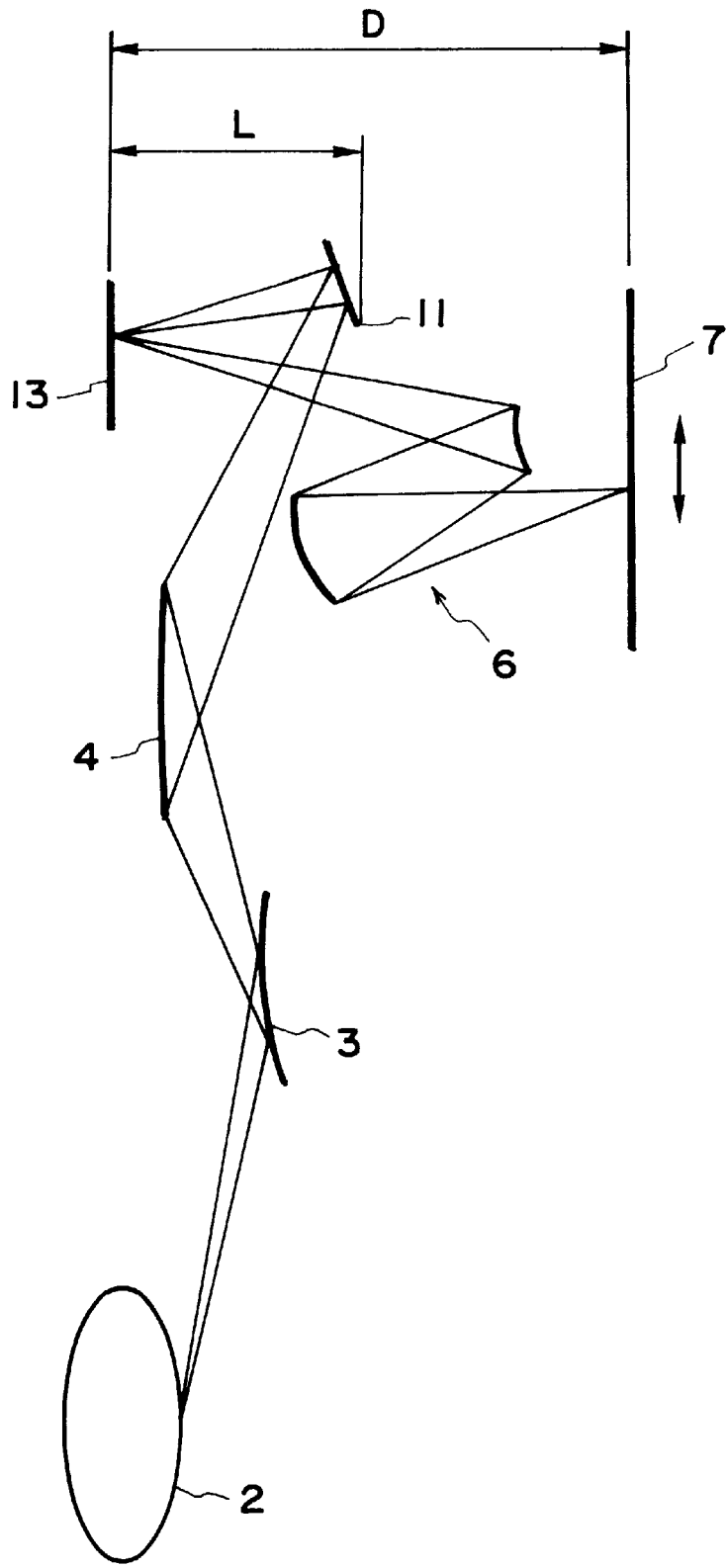
FIG. 5 is a schematic view of arrangement of an optical system of an an X-ray reduction exposure apparatus according to another embodiment of the present invention.

Referring now to FIG. 5, another embodiment of the present invention will be described. In this embodiment, illumination light is projected to an X-ray mask 13 while crossing an exposure optical system. In this embodiment, the orientation of the deflection mirror differs from that in the preceding embodiment, but the deflection mirror 11 is disposed at a position satisfying a relation $$D > L > d/(\tan \delta 1 + \tan \delta 2)$$

where L is the distance from the X-ray mask 13 to an edge of the deflection mirror 11 closer to the path of the X-ray beam reflected by the X-ray mask 13. While not shown in FIG. 5, d is the irradiation width of the X-ray beam upon the X-ray mask 13, δ1 is the incidence angle of the X-ray beam at the upper edge of the irradiation width d on the X-ray mask 13, and δ2 is the incidence angle of the X-ray beam at the lower edge of the irradiation width d upon the X-ray mask 13. Particularly, when the X-ray beam is projected on the X-ray mask 13 in the form of parallel light and thus δ1=δ2=δ, the deflection mirror 11 may be disposed at a position satisfying a relation $$D > L > d/(2 \tan \delta).$$

Since, in this embodiment, the X-ray source 2, convexed-surface total reflection mirror 3, concaved-surface multilayered-film reflection mirror 4 and reduction projection optical system 6 are similar to those of the FIG. 1 embodiment, a description therefor will be omitted here.

By disposing the deflection mirror 11 in the manner described above, it is possible to provide an X-ray reduction exposure apparatus wherein, even if a large-diameter wafer 7 is used and the exposure process is performed while moving the wafer in accordance with a step-and-scan sequence, the path of X-ray beam 12 is not intercepted by the deflection mirror 11 or the wafer 7, without enlarging the size of the apparatus.

Specifically, by disposing a deflection mirror so as to satisfy a relation $D > L > d/(\tan \delta 1 + \tan \delta 2)$, as described above, it is possible to accomplish a step-and-scan type X-ray reduction exposure apparatus without enlargement of the size of the apparatus, wherein, even if a large-diameter wafer is used, light projected to a mask or light emerging from the mask is not intercepted. Further, by disposing a deflection mirror at a position satisfying a relation $D > L > d/\{\tan(\theta - \phi 1) + \tan(\theta - \phi 2)\}$ while taking an angular aperture of the optical system into account, it is possible to set the position of the deflection mirror more exactly.

Figure 6:
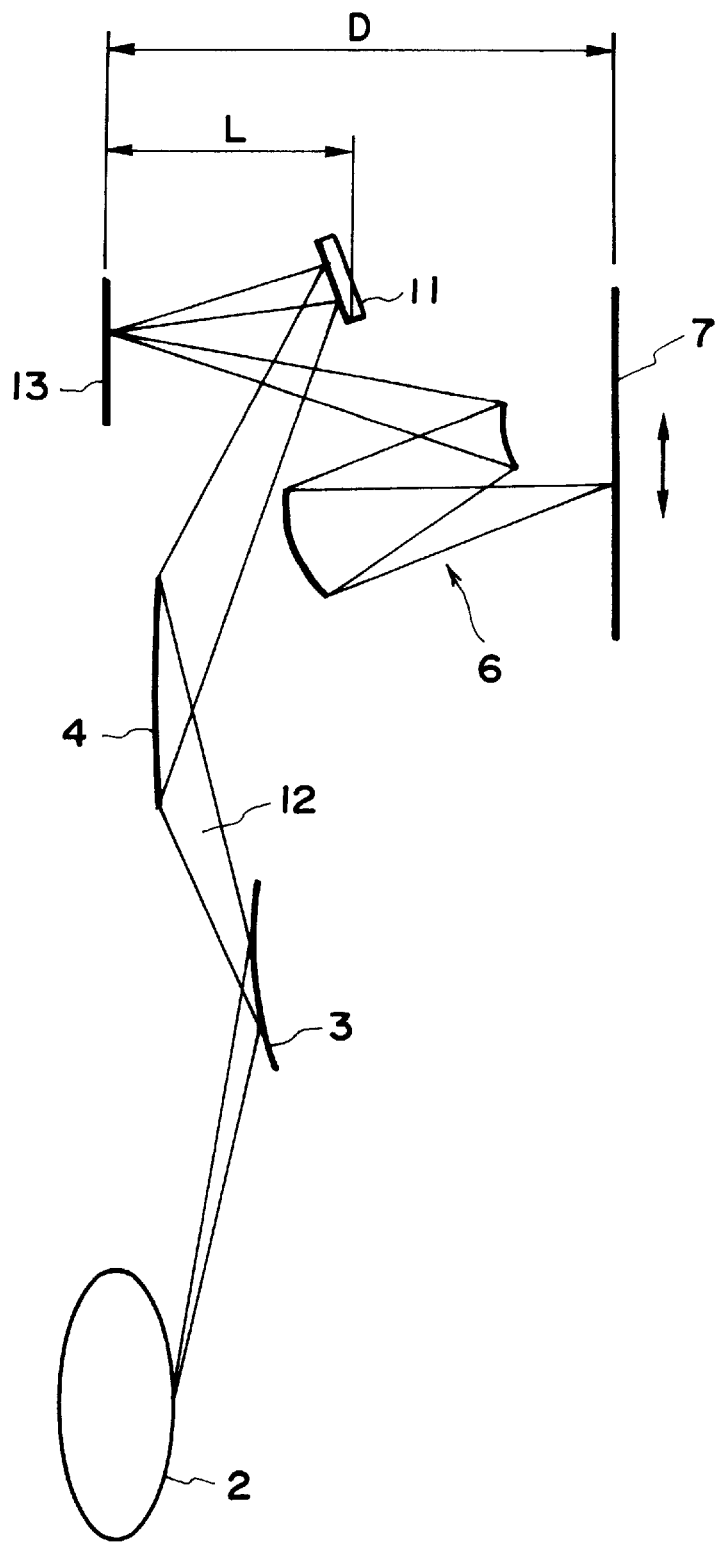
FIG. 6 is a schematic view of an arrangement of an optical system of an X-ray reduction exposure apparatus according to a further embodiment of the present invention.

FIG. 6 shows an arrangement of an optical system of an X-ray reduction exposure apparatus according to a further embodiment of the present invention. This exposure apparatus is a step-and-scan type exposure apparatus and it is adapted to perform reduction exposure of ⅕. Like numerals as those of the preceding embodiments are assigned to corresponding elements.

An X-ray mask 13 and a wafer 7 are disposed opposed to each other with a distance D therebetween. With the structure illustrated, the X-ray mask 13 is illuminated with a slit-like beam, and the X-ray mask 13 and the wafer 7 are relatively scanned at an appropriate speed. By repeating such relative scanning followed by stepwise motion, images of a pattern of the X-ray mask 13 are printed on the wafer 7 in a predetermined array. Here, the optical system from an X-ray source 2 to the X-ray mask 13 is called an illumination optical system, and the optical system from the X-ray mask 13 to the wafer 7 is called an exposure optical system.

An important feature of the X-ray reduction exposure apparatus according to this embodiment is that a deflection mirror 11 having cooling means is disposed between a concaved-surface multilayered-film reflection mirror 4 and the X-ray mask 13, such that X-ray beam 12 as reflected by the reflection mirror 14 is reflected by the deflection mirror 11 and is protected on the X-ray mask 13. The illumination light is protected across the exposure optical system.

The structure and disposition of the deflection mirror 11 will be described in detail, in conjunction with FIG. 7. The deflection mirror 11 may comprise a multilayered-film plane reflection mirror. It may be provided by depositing a hundred ten (110) alternate layers of molybdenum and silicon materials on a substrate, polished to remove surface roughness. Due to such a structure, there may be produced a small decrease or distortion in reflectivity in a peripheral portion (of about a few millimeters) of the deflection mirror 11. In consideration of it, such a portion is not used as a reflection region. The X-ray beam 12 is set to be projected to the region other than that portion. Further, in order to suppress heat generation of the deflection mirror 11 in response to irradiation with X-ray beam 12, a cooling unit 14 is mounted on the bottom of the deflection mirror 11.

Figure 7:
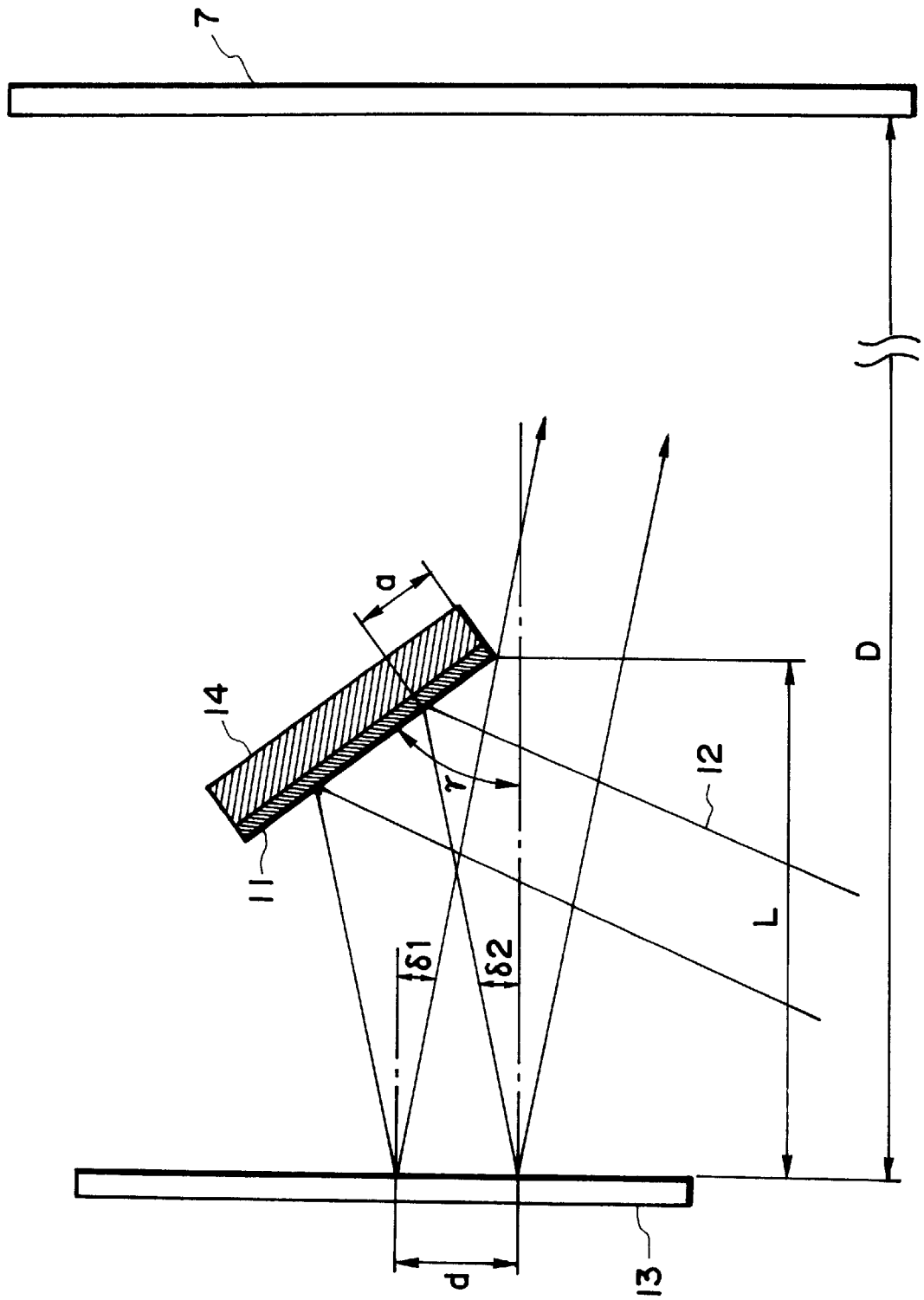
FIG. 7 is a schematic view for explaining the structure and disposition of a deflection mirror in the optical system shown In FIG. 6.

Here, as shown in FIG. 7, L is the distance from the X-ray mask 13 to an edge of the deflection mirror 11 closer to the path of X-ray beam 12 as reflected by the X-ray mask 13, a is the distance from that edge of the deflection mirror 11, functioning as a reference to the distance L, to the reflection region for the X-ray beam 12, d is the width of irradiation with which the X-ray mask 13 is irradiated with the X-ray beam 12, $\delta 1$ is the incidence angle of X-rays at one edge (lower edge in FIG. 7) of the irradiation width d of the X-ray beam 12 upon the X-ray mask 13, $\delta 2$ is the incidence angle of X-rays at the other edge (upper edge in FIG. 7) of the irradiation width d, and $\gamma$ is the angle defined between the reflection surface of the deflection mirror 11 and a normal to the X-ray mask 13.

Figure 8:
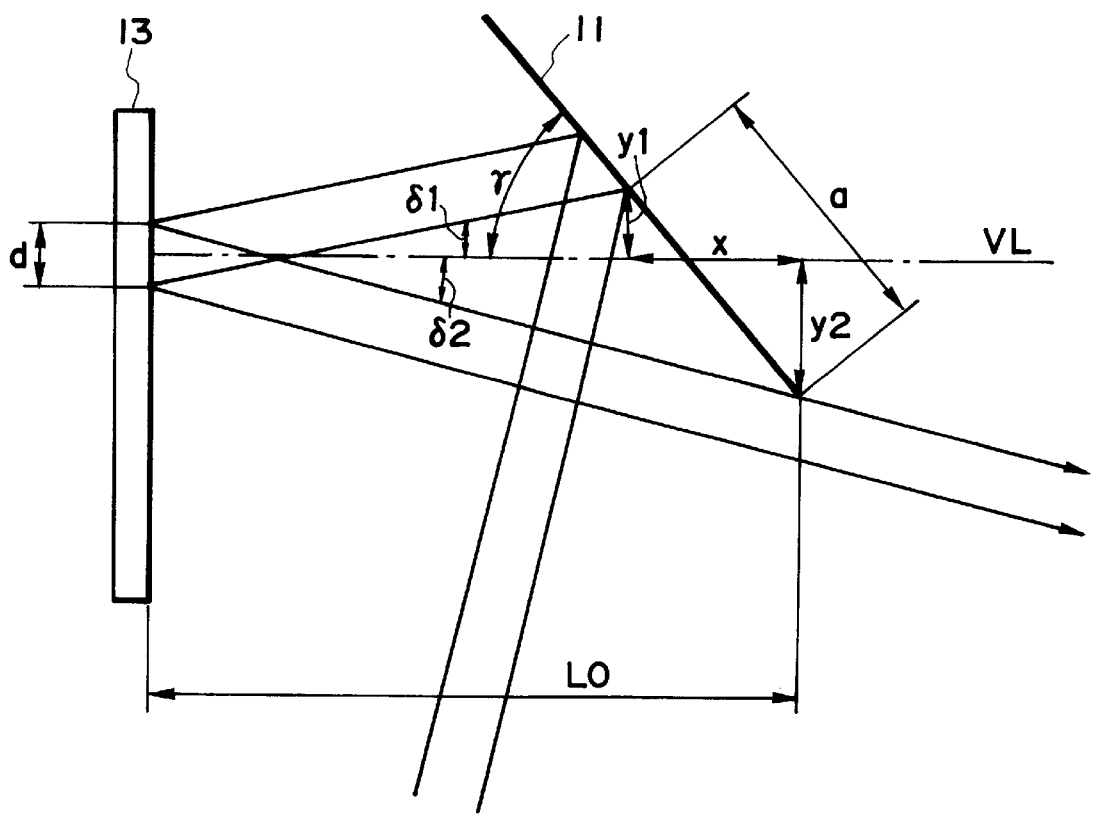
FIG. 8 is a schematic view for explaining a positional relation of the deflection mirror with the X-ray mask, in the optical system shown in FIG. 6.

Referring to FIG. 8, if the distance from the X-ray mask 13 to an edge of the deflection mirror 11 on an occasion when the edge of the deflection mirror 11 intersects with the X-ray beam 12 emerging from the X-ray mask 13, is denoted by L0, in order to avoid interception of the path of the X-ray beam 12, it is necessary that the deflection mirror be disposed at a distance larger than the distance L0. As shown in FIG. 8, VL is a normal to the X-ray mask 13, passing the center of the illumination region, y1 is the distance from the normal VL to the edge of the reflection region of the deflection mirror 11, y2 is the distance from the normal VL to the edge of the deflection mirror 11, and x1 is a component of the length a, in the direction of the normal, from the reflection region to the edge of the deflection mirror 11. Also, $\delta 1$ is the incidence angle of the X-ray beam at one edge of the X-ray mask 13, and $\delta 2$ is the incidence angle of the X-ray beam at the other edge of the X-ray mask.

Taking these distances into account, the following relations are derived:

$x = a \times \cos \gamma$ $y1 + y2 = a \times \sin \gamma$.

Also, $y1 + d/2 = (L0 - x) \times \tan \delta 1$ $y2 + d/2 = L0 \times \tan \delta 2$.

It follows from the above that:

$L0 \times (\tan \delta 1 + \tan \delta 2) = a \times (\sin \gamma + \cos \gamma \times \tan \delta 1) + d$.

Thus, when the deflection mirror 11 is disposed at a distance larger than $L0 = \{a \times (\sin \gamma + \cos \gamma \times \tan \delta 1) + d\}/(\tan \delta 1 + \tan \delta 2)$, the deflection mirror does not interfere with the path of the X-ray beam 12.

Further, as described hereinbefore, the deflection mirror should be disposed at a distance to the X-ray mask less than the distance to the wafer 7.

Thus, by disposing the deflection mirror at a position satisfying a relation $D > L > L0$, enlargement of the size of the apparatus can be avoided. Also, since the reflection region of the deflection mirror 11 uses a portion being free from non-uniform reflectivity due to machining distortion, for example, the X-ray mask 13 can be illuminated uniformly.

When angular apertures of the illumination system and the exposure system should be taken into account, as in the embodiment described above, the deflection mirror 11 may be disposed at a distance L which satisfies the following relation:

$D > L > \{a \times [\sin \gamma + \cos \gamma \times \tan (\theta - \phi 2)] + d\}/\{\tan(\theta - \phi 1) + \tan(\theta - \phi 2)\}$.

In a particular example, the distance D between the X-ray mask 13 and the wafer 7 was 800 mm, the incidence angle of the chief ray of the X-ray beam 12 onto the X-ray mask 13 was 4 deg., the angular aperture of the illumination system was 6 deg., the angular aperture of the exposure system was 4 deg., and the angle $\gamma$ defined between the reflection surface of the deflecting mirror 11 and a normal to the X-ray mask 13 was 40 deg. for avoiding interference with the mirrors of the exposure optical system. Also, as a result of experimental measurement to the surface precision of the deflection mirror and the reflectivity thereof to the X-ray beam 12, a small distortion was observed at the surface, in an outside peripheral region of a 10 mm width, and non-uniformness of reflectivity was observed in that portion. Then, the distance a from the edge of the deflection mirror 11 to the irradiation region of X-ray beam 12 was set to be equal to 12 mm. On that occasion, the right-hand side term of the condition described above became equal to 628 mm. Since D was 800 mm, L was set to be equal to 700 mm.

In accordance with the embodiment described above, it is possible to provide a step-and-scan type X-ray reduction exposure apparatus without enlargement of the size thereof, wherein even if a large-diameter wafer is used, the projected light to the mask is not intercepted and, additionally, the mask can be illuminated uniformly.

Further, the addition of an X-ray beam deflection mirror to the illumination system enables enlargement of the tolerance for the design of the incidence angle of the X-ray beam to the exposure apparatus, such that the degree of freedom of the layout is expanded. Particularly, when a synchrotron is used as a radiation source, it is preferable that a number of beam lines as much as possible are taken out, radially, from one synchrotron. However, increasing the number of beam lines results in a decrease in the spacing between adjacent beam lines. Thus, the expanded freedom of design of the incidence angle of the beam line to the exposure apparatus, attainable with the present invention, is very effective to create freedom with respect to the setting angle of each exposure apparatus. It is, therefore, possible with the present invention to accomplish compact disposition of exposure apparatuses within a device manufacturing factory.

Next, an embodiment of a device manufacturing method using an exposure apparatus or exposure method as described hereinbefore, will be explained.

Figure 9:
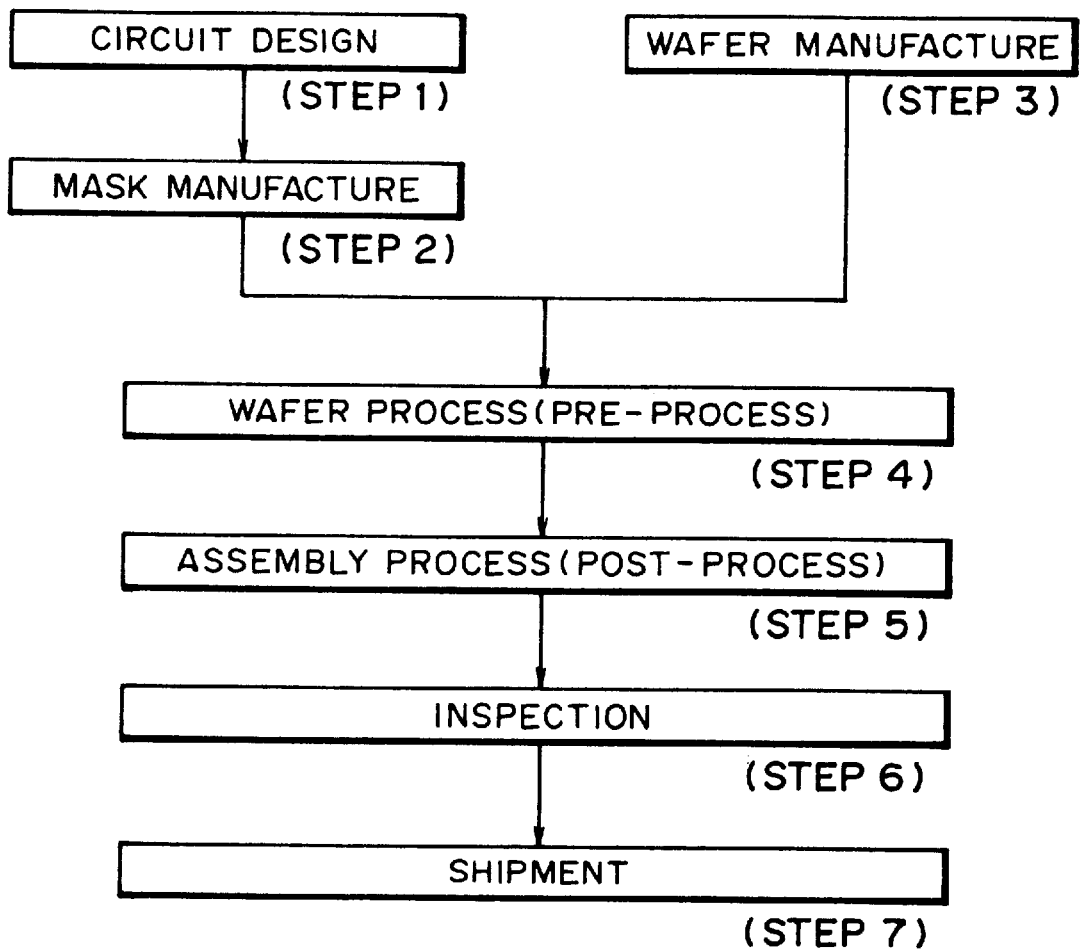
FIG. 9 is a flow chart of semiconductor device manufacturing processes.

FIG. 9 is a flow chart of the sequence of manufacturing a microdevice such as a semiconductor chip (e.g., an IC or an LSI), a liquid crystal panel, a CCD, a thin-film magnetic head or micro-machine, for example. Step 1 is a design process for designing the circuit of a semiconductor device. Step 2 is a process for manufacturing a mask on the basis of the circuit pattern design. Step 3 is a process for manufacturing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 10:
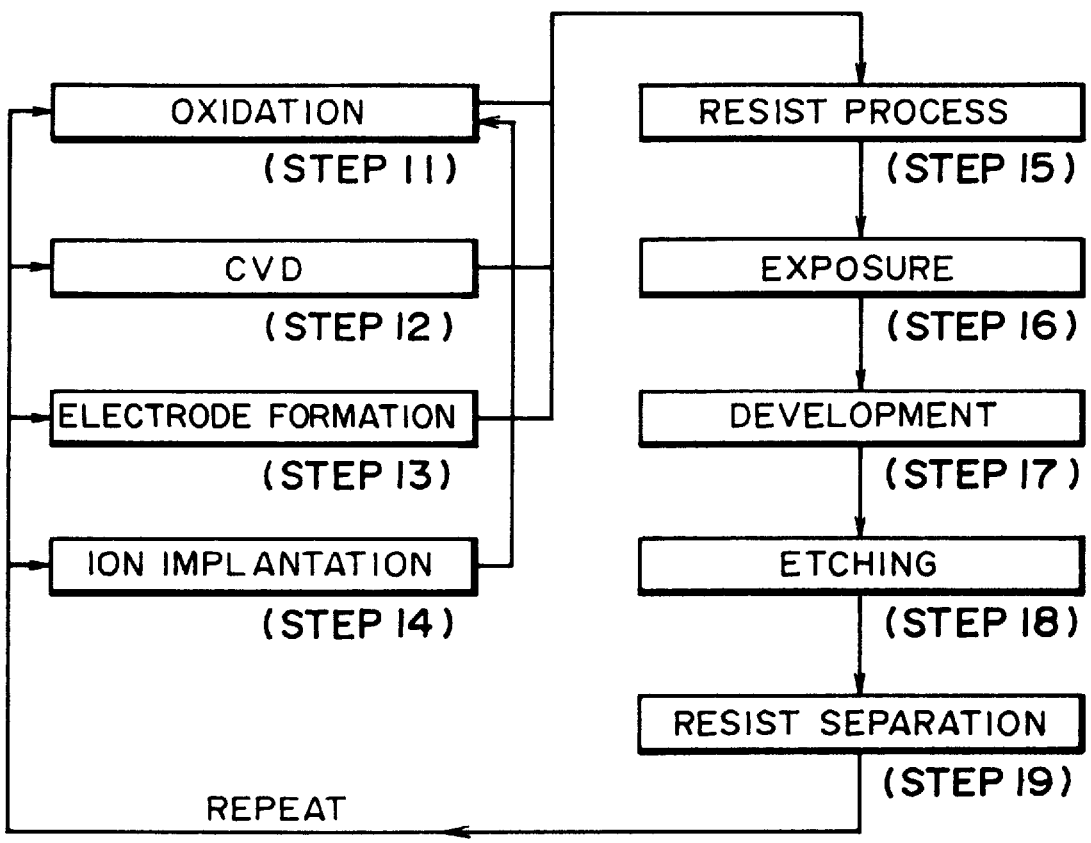
FIG. 10 is a flow chart for explaining a wafer process, in detail.

FIG. 10 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With the device manufacturing method of this embodiment, it is possible to produce a large-size device with a lower cost.

While the invention has been described with reference to the structures disclosed herein, it is not confined to the details set forth and this application is intended to cover such modifications or changes as may come within the purposes of the improvements or the scope of the following claims.

What is claimed is:

1. An X-ray reduction exposure apparatus, comprising:
   an X-ray illuminating optical system, comprising a curved mirror, for illuminating a mask pattern of a reflection type mask with X-rays, said X-ray illuminating optical system further comprising a deflection mirror for reflecting the X-rays from said curved mirror at a position before the reflection type mask, and for directing them toward the reflection type mask; and
   an X-ray reduction projection optical system for projecting, in a reduced scale, the mask pattern onto a wafer disposed so that a surface thereof to be illuminated is opposed to a reflection surface of the mask,
   wherein said X-ray reduction projection optical system and said deflection mirror are disposed in a space between the surface of the wafer to be exposed and the reflection surface of the mask.

2. An apparatus according to claim 1, further comprising operation means for printing mask patterns on different regions of the wafer in a predetermined array.

3. An apparatus according to claim 2, further comprising stages for holding and moving the mask and the wafer, respectively, and wherein said operation means comprises means for performing a step-and-scan sequence using said stages.

4. An apparatus according to claim 1, wherein said deflection mirror has a reflection surface on which a multilayered film reflector is formed.

5. An apparatus according to claim 1, further comprising cooling means mounted on the bottom of said deflection mirror.

6. An apparatus according to claim 1, wherein said deflection mirror is disposed at a position satisfying a relation:

$$D > L > d/(\tan \delta_1 + \tan \delta_2)$$

where L is the distance from the mask to an edge of said deflection mirror closer to the path of X-rays reflected by the mask, D is the distance between the mask and the wafer, d is the width of irradiation of the X-rays upon the mask, $\delta_1$ is the incidence angle of X-rays at an edge of the irradiation width d, and $\delta_2$ is the incidence angle of X-rays at the other edge thereof.

7. An apparatus according to claim 1, wherein said deflection mirror is disposed at a position satisfying a relation:

$$D > L > d/\{\tan(\theta - \phi_1) + \tan(\theta - \phi_2)\}$$

where L is the distance from the mask to an edge of said deflection mirror closer to the path of X-rays reflected by the mask, D is the distance between the mask and the wafer, d is the width of irradiation of the X-rays upon the mask, $\theta$ is the incidence angle of the optical axis of X-rays upon the mask, $\phi_1$ is the half angle of an angular aperture of an illumination optical system, and $\phi_2$ is the incidence angle of an angular aperture of an exposure optical system.

8. An apparatus according to claim 1, wherein said deflection mirror is disposed at a position satisfying a relation:

$$D > L > \{a \times (\sin \gamma + \cos \gamma \times \tan \delta_1) + d\}/\{\tan \delta_1 + \tan \delta_2\}$$

where L is the distance from the mask to an edge of said deflection mirror closer to the path of X-rays reflected by the mask, D is the distance between the mask and the wafer, a is the distance from the edge of said deflection mirror, functioning as a reference for the distance L, to the X-ray reflection region, $\gamma$ is the angle defined between the reflection surface of said deflection mirror and a normal to the mask, d is the width of irradiation of the X-rays upon the mask, $\delta_1$ is the incidence angle of X-rays at one edge of the irradiation width d, and $\delta_2$ is the incidence angle of X-rays at the other edge thereof.

9. An apparatus according to claim 1, wherein said deflection mirror is disposed at a position satisfying a relation:

$$D > L > \{a \times [\sin \gamma + \cos \gamma \times \tan(\theta - \phi 2)] + d\} / \{\tan(\theta - \phi 1) + \tan(\theta - \phi 2)\}$$

where L is the distance from the mask to an edge of said deflection mirror closer to the path of X-rays reflected by the mask, D is the distance between the mask and the wafer, a is the distance from the edge of said deflection mirror, functioning as a reference for the distance L, to the X-ray reflection region, γ is the angle defined between the reflection surface of said deflection mirror and a normal to the mask, d is the width of irradiation of the X-rays upon the mask, θ is the incidence angle of an optical axis of X-rays onto the mask, φ1 is the half angle of an angular aperture of an illumination optical system, and φ2 is the half angle of an angular aperture of an exposure optical system.

10. An apparatus according to claim 1, wherein said deflection mirror is disposed so as to deflect X-rays projected thereto in a direction intersecting the optical path of said X-ray reduction projection optical system.

11. An apparatus according to claim 1, wherein said deflection mirror comprises a flat mirror.

12. An apparatus according to claim 1, wherein the wavelength of the X-rays is within a range of about four nanometers to about twenty nanometers.

13. An apparatus according to claim 1, wherein the incidence angle of an optical axis of the X-rays upon the mask is at most four degrees.

14. An apparatus according to claim 1, wherein said X-ray reduction projection optical system comprises a plurality of mirrors, each having one of a convex surface and a concave surface, with a multilayered film reflector formed thereon.

15. An apparatus according to claim 1, wherein the mask has a multilayered reflective portion effective to define the mask pattern.

16. An apparatus according to claim 3, wherein said operation means controls said stages so that the mask and the wafer are relatively scanned at an appropriate speed ratio, which is related to the reduced scale of said X-ray reduction projection optical system.

17. An apparatus according to claim 10, wherein an acute angle is defined between a normal to the mask and the surface of said deflection mirror.

18. An apparatus according to claim 1, wherein said X-ray reduction projection optical system comprises mirrors of an even number.

19. An apparatus according to claim 1, wherein the mask and the wafer are placed substantially parallel to each other.

20. A device manufacturing method for producing a microdevice, said method comprising the steps of:

illuminating a mask pattern of a reflection type mask with X-rays, using an X-ray illuminating optical system having a curved mirror and a deflection mirror, said illuminating step comprising reflecting, by the deflection mirror, the X-rays from the curved mirror at a position before the reflection type mask, and directing them toward the reflection type mask; and projecting, in a reduced scale, the mask pattern onto a wafer disposed so that a surface thereof to be illuminated is opposed to a reflection surface of the mask, wherein said X-ray reduction projection optical system and said deflection mirror are disposed in a space between the surface of the wafer to be exposed and the reflection surface of the mask.

\* \* \* \* \*

UNITED STATES PATENT AND TRADEMARK OFFICE
CERTIFICATE OF CORRECTION

PATENT NO. : 5,995,582

DATED : November 30, 1999

INVENTORS : SHIGERU TERASHIMA, ET AL.

It is certified that error appears in the above-identified patent and that said Letters Patent is hereby corrected as shown below:

COLUMN 2:
Line 4, "remote" should read --removed--;
Line 28, "to and" should read --and to--; and
Line 58, "view of" should read --view of an--.

COLUMN 4:
Line 37, "it" should read --if--;
Line 57, "δ-2" should read --δ=2--; and
Line 63, "Paid" should read --paid--.

COLUMN 8:
Line 67, "as much as possible are taken out," should read --are taken out, as much as possible,--.

Signed and Sealed this

Twenty-seventh Day of March, 2001

Attest:

NICHOLAS P. GODICI

Attesting Officer     Acting Director of the United States Patent and Trademark Office